(12) United States Patent
Hofmann et al.

(10) Patent No.: US 6,180,979 B1
(45) Date of Patent: Jan. 30, 2001

(54) MEMORY CELL ARRANGEMENT WITH VERTICAL MOS TRANSISTORS AND THE PRODUCTION PROCESS THEREOF

(75) Inventors: Franz Hofmann, München; Josef Willer, Riemerling; Wolfgang Krautschneider, Hohenthann, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/142,462

(22) PCT Filed: Mar. 3, 1997

(86) PCT No.: PCT/DE97/00372

§ 371 Date: Sep. 8, 1998

§ 102(e) Date: Sep. 8, 1998

(87) PCT Pub. No.: WO97/34323

PCT Pub. Date: Sep. 18, 1997

(30) Foreign Application Priority Data

Mar. 12, 1996 (DE) ................................................ 196 09 678

(51) Int. Cl.[7] .................................................. H01L 29/72
(52) U.S. Cl. .......................... 257/329; 257/330; 257/332; 257/335; 257/336; 257/344
(58) Field of Search ..................... 257/329, 330, 257/332, 335, 336, 344

(56) References Cited

U.S. PATENT DOCUMENTS

| 4,663,644 | 5/1987 | Shimizu . |
| 5,117,389 | 5/1992 | Yiu . |
| 5,306,941 | 4/1994 | Yoshida . |
| 5,429,973 | 7/1995 | Hong . |
| 5,448,090 | 9/1995 | Geissler et al. . |
| 5,453,637 | 9/1995 | Fong-Chun et al. . |

FOREIGN PATENT DOCUMENTS

| 42 14 923 A1 | 12/1992 | (DE) . | |
| 0 399 191 A1 | 11/1990 | (EP) . | |
| 0399191 | * 11/1990 | (EP) | .................................. 257/329 |
| 3-190165 | 8/1991 | (JP) . | |
| 4-226071 | 8/1992 | (JP) . | |
| 5-110036 | 4/1993 | (JP) . | |
| 7-142610 | 6/1995 | (JP) . | |

* cited by examiner

Primary Examiner—Edward Wojciechowicz
(74) Attorney, Agent, or Firm—Shiff Hardin & Waite

(57) ABSTRACT

In a memory cell arrangement which has vertical MOS transistors as memory cells, the information is stored by different threshold voltages of the transistors. For this purpose, dopant regions are formed for an information state by angled implantation or outdiffusion in the upper region of the channel region. The lower region of the channel region is in this case covered by an etching residue (9') which is formed by masked spacer etching. The arrangement can be produced with an area requirement for each memory cell of $2 F^2$ (F: minimum structure size).

3 Claims, 4 Drawing Sheets

MEMORY CELL ARRANGEMENT WITH VERTICAL MOS TRANSISTORS AND THE PRODUCTION PROCESS THEREOF

BACKGROUND OF THE INVENTION

In order to store large volumes of data, for example for DP (data processing) applications or for the digital storage of music or images, use is mainly made at present of memory systems which have mechanically moved parts such as, for example, hard disc memories, floppy discs or compact discs. The moved parts are subject to mechanical wear. Furthermore, they require a comparatively large volume and permit only slow data access. Moreover, since they are sensitive to vibrations and position and have a comparatively high power consumption for their operation, these memory systems can be used in mobile systems only to a limited extent.

In order to store relatively small volumes of data, semiconductor-based read-only memories are known. These are often realized as a planar integrated silicon circuit in which MOS transistors are used as memory cells. The transistors are selected via the gate electrode, which is connected to the word line. The input of the MOS transistor is connected to a reference line and the output is connected to a bit line. During the read operation, it is assessed whether or not a current is flowing through the transistor. The logic values zero and one are assigned correspondingly. The storage of zero and one is effected in technical terms in that no MOS transistor is produced or no conductive connection to the bit line is realized in memory cells in which the logic value assigned to the state "no current flow through the transistor" is stored. As an alternative, MOS transistors which have different threshold voltages due to different dopant concentrations in the channel region can be realized for the two logic values.

These semiconductor-based memories permit random access to the stored information. The electrical power required to read the information is distinctly less than in the case of the abovementioned memory systems having mechanically moved parts. Since no moved parts are required, mechanical wear and sensitivity to vibrations are no longer a problem here either. Semiconductor-based memories can therefore be used for mobile systems as well.

The silicon memories described generally have a planar structure. A minimum area requirement thus becomes necessary for each memory cell and is $4 F^2$ in the most favorable case, F being the smallest structure size that can be produced with the respective technology.

A read-only memory cell arrangement whose memory cells comprise MOS transistors is disclosed in German reference DE 42 14 923 A1. These MOS transistors are arranged along trenches in such a way that a source region adjoins the bottom of the trench, a drain region adjoins the surface of the substrate and a channel region adjoins the side and bottom of the trench both vertically with respect to the surface of the substrate and parallel to the surface of the substrate. The surface of the channel region is provided with a gate dielectric. The gate electrode is designed as a side covering (spacer). The logic values zero and one are differentiated by different threshold voltages, which are effected by channel implantation. During the channel implantation, the implanting ions impinge on the surface of the respective trench at an angle such that implantation is deliberately effected only along one side due to shading effects of the opposite side. In this memory cell arrangement, the word lines run as spacers along the sides of the trenches.

Japanese reference JP-A 4-226071 discloses a further memory cell arrangement, which comprises vertical MOS transistors arranged on the sides of trenches as memory cells. In this case, diffusion regions which in each case form the source/drain regions of the vertical MOS transistors run on the bottom of trenches and between adjacent trenches. The word lines, which comprise the gate electrodes of the vertical MOS transistors, run perpendicularly to the trenches. The threshold voltage of the vertical MOS transistors is set by means of angled implantation.

U.S. Pat. No. 4,663,644 discloses a memory cell arrangement whose memory cells comprise vertical MOS transistors. These vertical MOS transistors are each arranged on the sides of trenches. The word lines, which each comprise the gate electrodes of the vertical MOS transistors, are arranged in the trenches. Two word lines are arranged in each trench. The bit lines are realized as conductor tracks on the surface of the substrate. The contact between the bit lines and the respective source/drain regions which adjoin the surface of the substrate is realized via a contact hole. The source/drain regions which adjoin the bottom of the trenches are realized as a continuous doped layer and are put at the reference potential. In this memory cell arrangement, the information is stored in the form of threshold voltages, having different levels, of the MOS transistors. The different threshold voltages are realized by different dopant concentrations in the channel region of the MOS transistors. In order to form an increased dopant concentration in the channel region, a doped layer is deposited and is structured in such a way that sides in which increased dopant concentrations are to be formed remain covered by the structured dopant layer. The channel regions having an increased dopant 25 concentration are formed by outdiffusion of the structured dopant layer.

SUMMARY OF THE INVENTION

The problem underlying the invention is that of specifying a semiconductor-based memory cell arrangement in which an increased storage density is achieved and which can be produced with few production steps and a high yield. Furthermore, it is intended to specify a method for the production of such a memory cell arrangement.

In the memory cell arrangement according to the invention, memory cells which each comprise an MOS transistor which is vertical with respect to the main area are provided in a substrate. A substrate made of monocrystalline silicon or the silicon layer of an SOI substrate is preferably used as the substrate. The vertical MOS transistors have different threshold voltages depending on the stored information.

For the purpose of reading out the information, the MOS transistors are driven at a voltage level at which the MOS transistors having a lower threshold voltage conduct and those having a higher threshold voltage do not conduct.

Strip-like trenches which essentially run in parallel are provided in the substrate. Strip-like doped regions, which are doped by a second conductivity type which is opposite to the first, are arranged on the bottom of the trenches and on the main area between adjacent trenches. Gate dielectrics are in each case arranged on the sides of the trenches. Word lines are provided which run transversely with respect to the trenches and comprise gate electrodes for the vertical MOS transistors in the region of the sides of the trenches. The vertical MOS transistors are in each case formed by two strip-like, doped regions adjoining the same side of one of the trenches, which doped regions act as source/drain region, the trench side arranged in between, the gate dielectric and the part of one of the word lines arranged thereabove. The strip-like doped regions are used as bit or reference line during operation of the memory cell arrangement.

For the purpose of realizing the different threshold voltages, memory cells in which a predetermined information item is stored have a dopant region in the upper region of the side of the trench, the extent of which dopant region perpendicular to the main area is smaller than the depth of the trenches. The dopant regions are preferably doped by the same conductivity type as the channel regions, but with an increased dopant concentration. The threshold voltage rises in this case. They can also be doped by the opposite conductivity type, in which case the threshold voltage then decreases.

The invention makes use of the finding that the threshold voltage of an MOS transistor can also be set by a locally inhomogeneous dopant concentration in the channel region. The parts of the dopant region and its accurate alignment with respect to the associated word line are therefore non-critical.

If the memory cell arrangement is to be used in the sense of a multi-value logic arrangement, then it lies within the scope of the invention for the vertical MOS transistors to have more than two different threshold voltages. In this case, the dopant regions are realized with different dopant concentrations in the sides.

The spacing between adjacent trenches is preferably chosen in such a way that it is essentially equal to the width of the trenches. The spacing between adjacent word lines is likewise chosen to be equal to the width of the word lines. If the width of the trenches and the width of the word lines are chosen to correspond to the minimum structure width F in the respective technology, this produces a space requirement of 2 $F^2$ for the memory cell. If a minimum structure width of F=0.4 $\mu$m is taken as a basis, then a storage density of about 3.1 bits/$\mu m^2$ is achieved in the memory cell arrangement.

In order to produce the memory cell arrangement according to the invention, strip-like trenches which essentially run in parallel are preferably formed in a main area of a substrate. Strip-like, doped regions, which are doped by a second conductivity type which is opposite to the first, are formed on the bottom of the trenches and on the main area between adjacent trenches. A mask layer which has an essentially conformal edge covering is subsequently applied. A mask which is made, for example, of photoresist and has openings is produced on the mask layer. The mask layer is structured using the mask such that the main area and the surface at the bottoms of the trenches are exposed in the region of the openings. On the other hand, the sides of trenches in the region of the openings are only partially exposed, with the result that a residue of the mask layer remains on these sides in the lower region of the trenches.

Dopant regions are subsequently produced in the exposed side parts. After the removal of the structured mask layer, a gate dielectric is formed on the sides of the trenches. Finally, word lines which run transversely with respect to the trenches are formed.

The trenches are preferably formed by anisotropic etching using a trench mask.

The strip-like, doped regions on the bottom of the trenches and on the main area between adjacent trenches are preferably produced by an implantation after the trench formation and after the removal of the trench mask. In this case it is advantageous to provide the sides of the trenches with spacers prior to the implantation, which spacers have a masking action during the implantation. These spacers are subsequently removed. The formation of the trenches and of the strip-like, doped regions requires only one mask.

As an alternative, the strip-like, doped regions can be produced by producing a doped region on the main area, which doped region covers the entire memory cell field, before the formation of the trenches. When the trenches are opened, this doped region is subdivided into the strip-like, doped regions on the main area. The strip-like, doped regions on the bottom of the trenches are produced by ion implantation after the trenches have been opened. When using a trench mask, it is advantageous here to leave it as a mask on the main area during the implantation.

The mask layer is preferably structured by anisotropic etching. However, the mask layer can also be structured by combined isotropic and anisotropic etching. The etching takes place selectively with respect to the substrate.

In the method according to the invention, the main area and the bottoms of the trenches are in fact exposed in the region of the openings. However, since a residue of the mask layer remains on the sides of the trenches, the etching attack on the exposed main area and the exposed bottoms of the trenches, which attack is unavoidable owing to the finite selectivity of etching, is reduced.

Since the threshold voltage depends only on the dopant concentration in the channel region, both the exact depth of the dopant region and the lateral alignment of the latter with regard to the arrangement of the gate electrodes are non-critical.

The dopant regions are preferably formed by angled implantation in the exposed side parts. The implantation is preferably carried out at an angle of inclination in the range between 20° and 30° with respect to the normal of the main area. Angles of inclination of this type are provided as standard in many implantation installations in order to avoid the channeling effect.

As an alternative, the dopant regions are produced by outdiffusion of a doped layer. The doped layer is applied over the whole area above the structured mask layer. The doped layer is preferably formed from doped glass, doped polysilicon or doped amorphous silicon. The use of doped glass has the advantage that the doped layer can in this case be removed selectively with respect to the substrate.

The introduction of the mask layer into the process according to the invention leads to the following advantages:

only one mask is required for programming the memory cell arrangement. In contrast to this, the memory cell arrangements disclosed in German reference DE 42 14 923 A1 and Japanese reference JP-A 4-22 60 71 each require two masks for programming.

After the structuring of the mask layer, the mask used for structuring can be removed, in order to avoid shading by the mask during the following implantation. As a result, the method according to the invention can also be used for trench widths which may be distinctly smaller than in the memory cell arrangement disclosed in German reference DE 42 14 923 A1.

If the mask for structuring the mask layer is formed from photoresist, then the photoresist does not have to be fully exposed right down to the bottom of the trench during exposure for the purpose of programming. Modern exposure steppers which have a focus depth of <0.5 $\mu$m can thus also be used in the method according to the invention. Since it is not absolutely necessary to remove the mask layer at the bottom of the trench, unexposed photoresist may remain on the trench bottom in the method according to the invention. This avoids any exposure problems over the complete topology of the trench.

When the dopant regions are formed by outdiffusion of a doped layer, the latter is not structured, in contrast to the method disclosed in U.S. Pat. No. 4,663,644. This avoids any problems which arise during the structuring over the topology of the trench.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
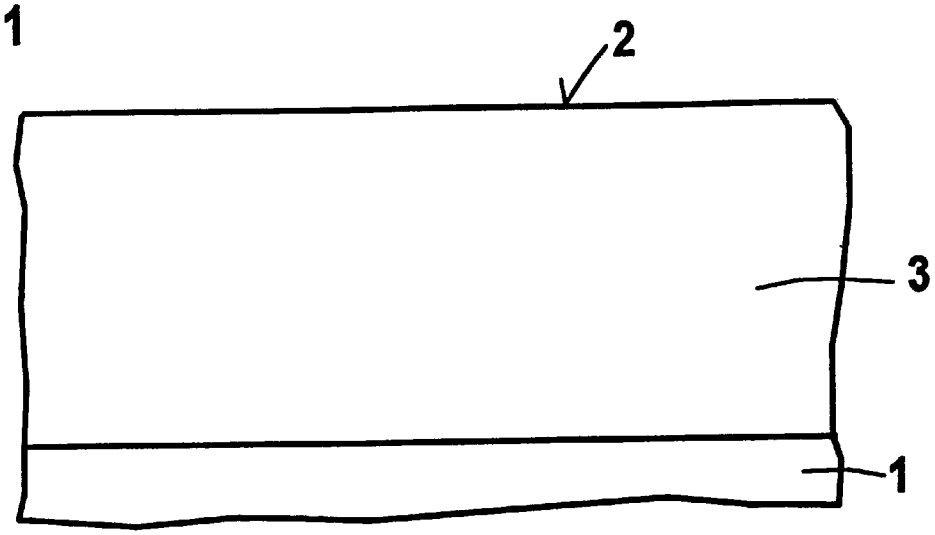
FIG. 1 shows a substrate with a trough which is doped by a first conductivity type.

In a substrate 1 made, for example, of p-doped monocrystalline silicon having a dopant concentration of $5 \times 10^{15}$ $cm^{-3}$, a p-doped trough 3 having a dopant concentration of $2 \times 10^{17}$ $cm^{-3}$ is produced in a main area 2 by implantation and subsequent heat treatment (see FIG. 1). During the implantation of the p-doped trough 3, use is made of a screen oxide (a thin oxide to protect the substrate surface during the implantation) with a thickness of, for example, 50 nm (not illustrated), which is removed again after the driving in of the p-doped trough 3 at 180 keV, $7 \times 10^{12}$ $cm^{-2}$. The p-doped trough 3 extends at least over a region for a cell field.

An $SiO_2$ layer is deposited on the main area 2 to a layer thickness of, for example, 300 nm, for example using a TEOS method. The $SiO_2$ layer is structured with the aid of photolithographic process steps, a trench mask 4 being formed. The trench mask 4 has strip-like openings which essentially run in parallel. The strip-like openings in the trench mask 4 have a width of, for example, 0.4 μm, a length of, for example, 125 μm and a spacing of 0.4 μm.

Figure 2:
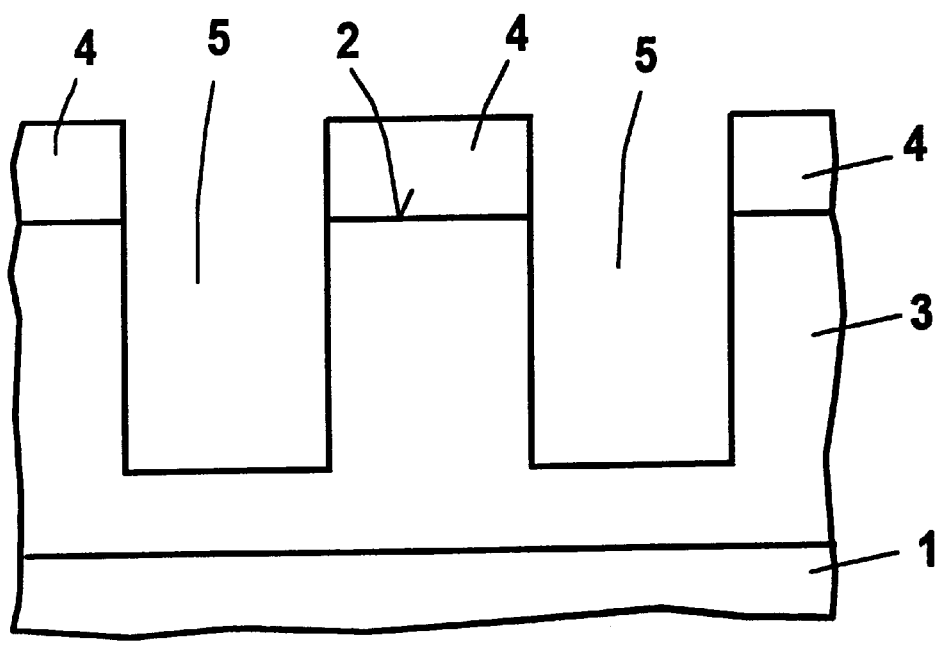
FIG. 2 shows the substrate after the etching of strip-like trenches.

Trenches 5 are etched into the main area 2 of the substrate 1 in an anisotropic etching process, for example with HBr, He, $O_2$, $NF_3$, while using the trench mask 4 as etching mask. The trenches 5 have a strip-like cross-section corresponding to the openings in the trench mask 4 parallel to the main area 2. They have a width of, for example, 0.4 μm, a length of, for example, 125 μm and a spacing of, for example, 0.4 μm. The depth of the trenches is, for example, 0.6 μm (see FIG. 2). 32 parallel trenches 5 are formed, for example.

Figure 3:
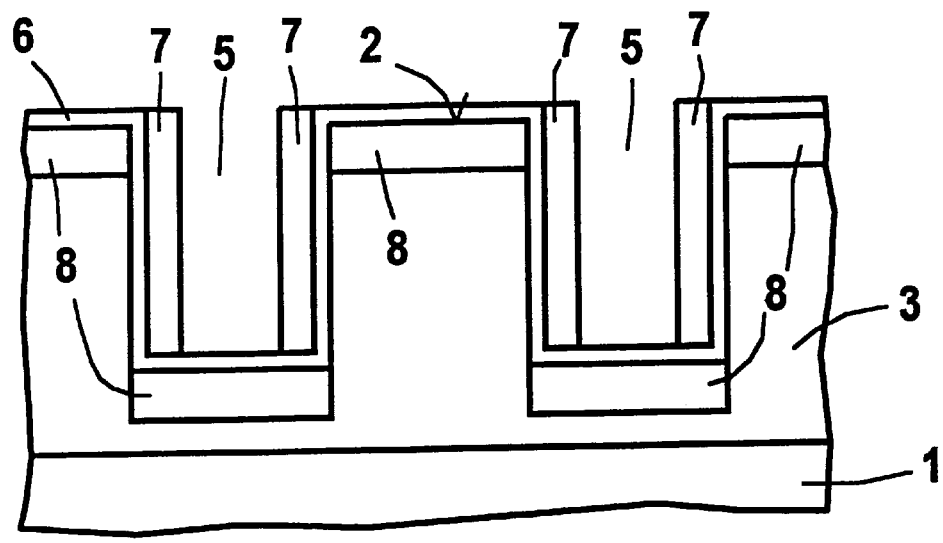
FIG. 3 shows the substrate after the formation of strip-like, doped regions on the bottoms of the trenches and between adjacent trenches on the main area.

The trench mask 4 is subsequently stripped off using an HF dip, for example. In order to improve the quality of the crystal surfaces, an $SiO_2$ layer 6 (so-called sacrificial oxide) is produced by thermal oxidation to a thickness of, for example, 20 nm (see FIG. 3). $SiO_2$ spacers 7 are produced on vertical sides of the trenches 5 by conformal deposition, for example using a TEOS method, of an $SiO_2$ layer to a layer thickness of, for example, 60 nm and subsequent anisotropic dry etching using $CHF_3$, $O_2$ (see FIG. 3). A thin screen oxide is subsequently deposited using a TEOS method (not illustrated). $n^+$ Doped, strip-like regions 8 are formed on the bottom of the trenches 5 and on the main area 2 between adjacent trenches 5 by means of implantation perpendicular to the main area 2 using As at a dose of $5 \times 10^{15}$ $cm^{-2}$ and an energy of 80 keV and a subsequent heat treatment step for dopant activation. A dopant concentration of, for example, $10^{21}$ $cm^{-3}$ is set in the strip-like, doped regions 8. The $SiO_2$ layer 6 acts as a screen oxide during the implantation.

Figure 4:
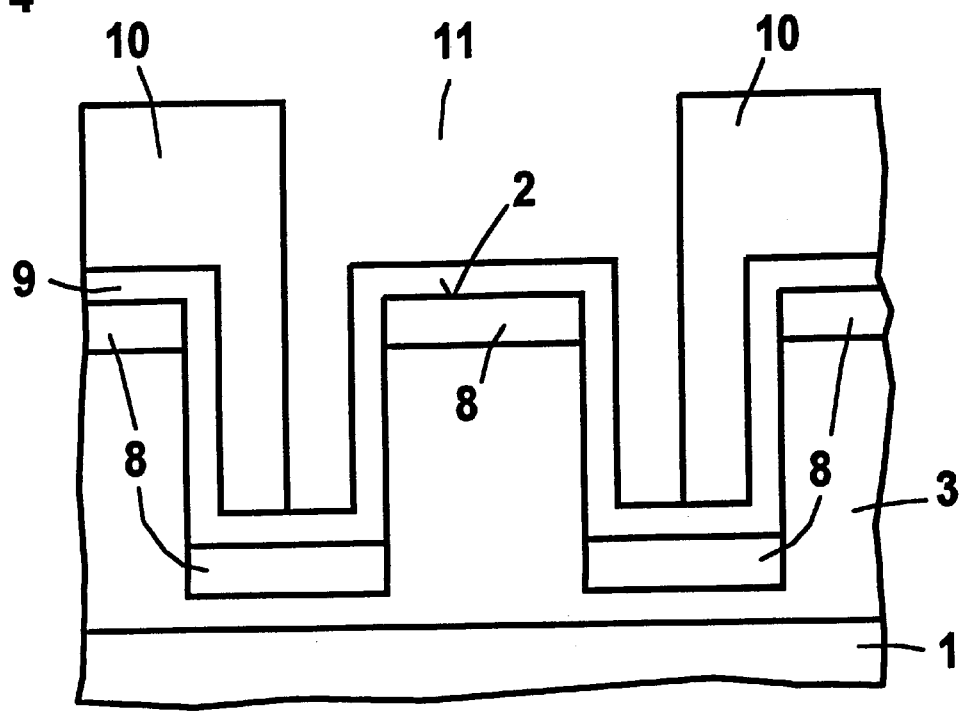
FIG. 4 shows the substrate after the application of a mask layer and the formation of a mask.

The $SiO_2$ spacers 7 and the $SiO_2$ layer 6 are subsequently removed, for example, by wet-chemical etching using an HF dip. A mask layer 9 of $SiO_2$ having essentially conformal edge covering is deposited, for example using a TEOS method. The mask layer 9 is deposited to a layer thickness of 60 to 80 nm (see FIG. 4).

A mask 10 made, for example, of photoresist is subsequently formed using photolithographic process steps. The mask 10 has openings 11 in the cell field. The region outside the cell field in which a periphery for the memory cell arrangement is formed, for example, is covered by the mask 10. The openings 11 are aligned in such a way that they each overlap at least one side of the trenches 5. The dimensions of the openings 11 parallel to the main area 2 in each case correspond to the width of the trenches 5. Larger dimensions of the openings 11 are achieved by the coincidence of adjacent openings. The mask 10 is aligned in such a way that the openings 11 are in each case arranged such that they overlap the sides of the trenches 5. If the trenches 5 are formed with a width corresponding to the minimum structure size F that can be produced with the respective technology and is, for example, 0.4 μm, then the openings 11 likewise have minimum dimensions of F×F. When aligning the mask 10, use is made in this case of the fact that the alignment accuracy is in each case greater than the smallest structure size F that can be produced with the respective technology. In 0.4 μm technology, the alignment accuracy is, for example, F/2 to F/3.

The mask layer 9 is structured using an anisotropic etching method, for example with HBr, $Cl_2$, He. The mask 10 acts as etching mask in this case. In this process, etching residues 9' remain on the sides of the trenches 5 in the region of the openings 11. In the region of the openings 11, the silicon surface is exposed on the bottoms of the trenches 5 and on the main area 2 between adjacent trenches 5. Under the mask 10, on the other hand, the mask layer 9 is not attacked.

Although the mask layer 9 is structured using an etching method which is selective with respect to silicon, there is, nevertheless, an etching attack on the exposed surfaces made of silicon owing to the limited selectivity. Since the etching residues 9' remain on the sides of the trenches 5 the etching attack on the exposed silicon surfaces, which attack is unavoidable on account of the finite selectivity, is reduced.

The height of the etching residues 9' is lower than would correspond to the depth of the strip-like, doped regions 8 arranged on the main area 2. The height of the etching residues 9' is, for example, 300 nm. The exact height of the etching residues 9' is not critical here, as long as part of the trench wall below the strip-like, doped region 8 adjoining the trench wall is exposed.

Figure 5:
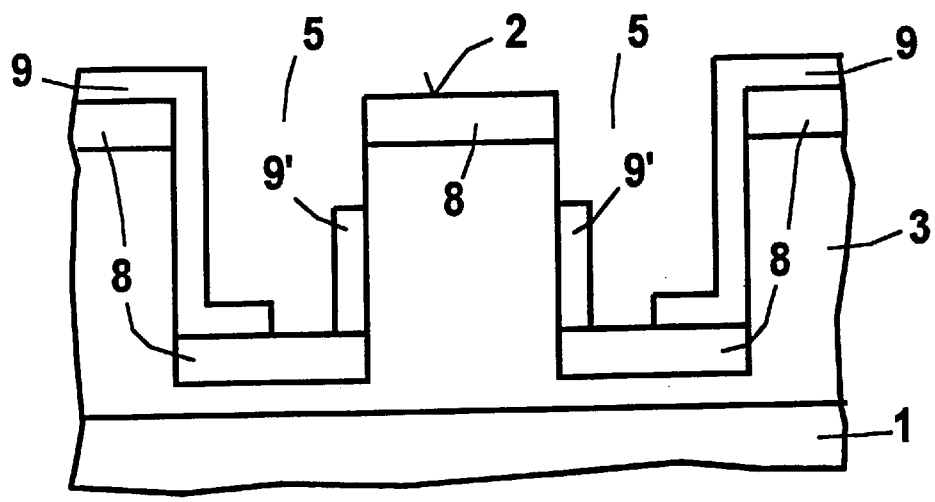
FIG. 5 shows the substrate after structuring of the mask layer.

Parts of the mask layer 9 which are exposed by the mask 10 and are on the bottom of the trenches 5 are removed during the structuring of the mask layer 9. In the event that the photoresist has not been completely exposed right down to the bottom of the trenches 5 when the mask 10 is formed from photoresist, the mask layer 9 is covered by unexposed photoresist at the bottom of the trenches 5. In this case, the mask layer 9 is not attacked during the anisotropic etching at the bottom of the trenches 5 and the bottom of the trenches 5 remains covered by the mask layer 9. This is not critical for the further procedure of the method according to the invention. The mask 10 is removed after the structuring of the mask layer 9, 9' (see FIG. 5).

A thin screen oxide (approximately 10 nm) is subsequently deposited using a TEOS method (not illustrated).

Two angled implantations are subsequently carried out using boron at a dose of $10^{13}$ cm$^{-2}$ to $5 \times 10^{13}$ cm$^{-2}$ and an energy of 60 keV. In this case, the angle of inclination with respect to the normal of the main area 2 is 20° to 30°, and −20° to −30°. Dopant regions 12 are formed here in the exposed sides of the trenches 5 above the etching residues 9' (see FIG. 7). A dopant concentration of a few $10^{17}$ cm$^{-3}$, preferably $8 \times 10^{17}$ cm$^{-3}$, is set in the dopant regions 12. Since the doping in the strip-like, doped regions 8 is $10^{21}$ cm$^{-3}$, the implantation of boron can be tolerated in this region. In the event that unexposed photoresist has remained on the bottom of the trenches 5 when the mask 10 is formed, and the bottoms of the trenches 5 are covered with the mask layer 9, there is no implantation of boron into the strip-like, doped regions 8 arranged on the bottom of the trenches 5. The formation of the dopant regions 12 in the exposed sides of the trenches 5 is not impaired by this.

Figure 6:
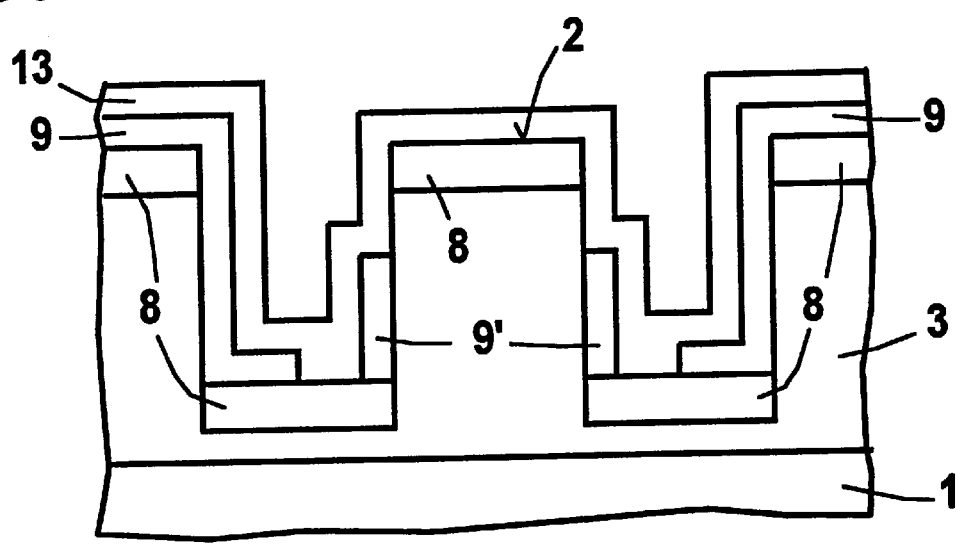
FIG. 6 shows the substrate after the application of a doped layer.

As an alternative, the dopant regions 12 in the sides of the trenches 5 are formed by outdiffusion of a doped layer 13. For this purpose, the mask 10 is removed and then the doped layer 13 made, for example, of borosilicate glass is deposited to a layer thickness of 50 nm over the whole area (see FIG. 6). The dopant regions 12 are produced by outdiffusion in a heat treatment step at, for example, 900°. The doped layer 13 is subsequently removed, for example, using an HF dip.

Figure 7:
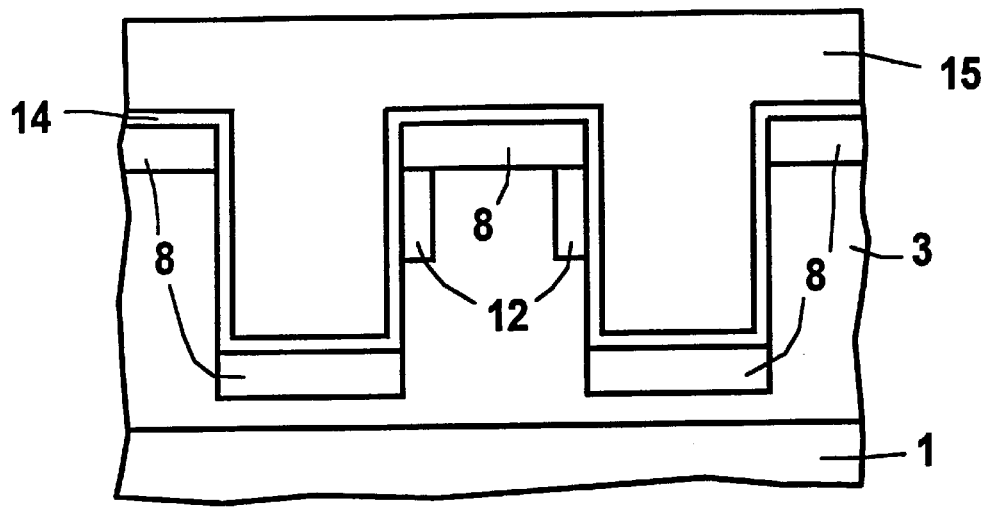
FIG. 7 shows the substrate after the formation of dopant regions in the sides of the trenches and after formation of word lines which run transversely with respect to the trenches.

The structured mask layer 9 and the etching residues 9' are subsequently removed by wet-chemical etching using HF (see FIG. 7). A gate dielectric 14 is produced, for example, by thermal oxidation to a layer thickness of, for example, 10 nm. An n$^+$-doped polysilicon layer is subsequently applied over the whole area to a layer thickness of 400 nm. This is preferably done by the in situ-doped deposition of polysilicon. As an alternative, the polysilicon layer is deposited in undoped form and is subsequently doped by coating with a POCL layer (POCL stands for PCl$_3$: phosphorus chloride gas). The doped polysilicon layer is structured by anisotropic etching with the aid of photolithographic process steps. This produces word lines 15 which run transversely with respect to the trenches 5 (see FIG. 7 and FIG. 8). The word lines 15 have a width of, for example, F=0.4 μm. The spacing between adjacent word lines 15 is likewise F.

The vertical MOS transistors are in each case formed by two strip-like doped regions 8 which adjoin the same side of one of the trenches 5, that part of the trough 3 which is arranged in between as channel region, the gate dielectric 14 and the adjoining part of one of the word lines 15. The extent of the vertical MOS transistor parallel to the course of the strip-like trenches is given by the width of the word lines 15. MOS transistor which are adjacent along one side of one of the trenches are separated from one another by the spacing between adjacent word lines 15. The strip-like, doped regions 8 in each case run over the entire cell field. They form lines which, depending on the interconnection, are used as a bit line or reference line and interconnect the source/drain regions of MOS transistors which are adjacent along a trench.

Depending on whether or not a dopant region 12 is arranged in the side of the respective trench 5, the vertical MOS transistor does or does not have an increased threshold voltage. The information stored in the memory cell arrangement is stored in the presence or absence of the dopant regions 12. The memory cell arrangement is therefore programmed during the structuring of the mask layer 9. The information is transmitted into the memory cell arrangement via the arrangement of the openings 11 in the mask 10.

For the purpose of reading out the memory cells, the strip-like, doped regions 8 are used as a bit or reference line. The memory cell to be assessed is selected via the word line. The word line has in this case applied to it a control signal whose voltage level lies between the threshold voltage of the MOS transistors having a dopant region 12 in the channel region and that of the MOS transistors not having a dopant region 12 in the channel region. In the presence of this control signal, the MOS transistors not having a dopant region 12 in the channel region are switched on, while the MOS transistors which do have a dopant region 12 in the channel region, and have an increased threshold voltage, remain switched off. During read-out, it is assessed whether or not a current flows between the associated strip-like, doped regions 8.

Figure 8:
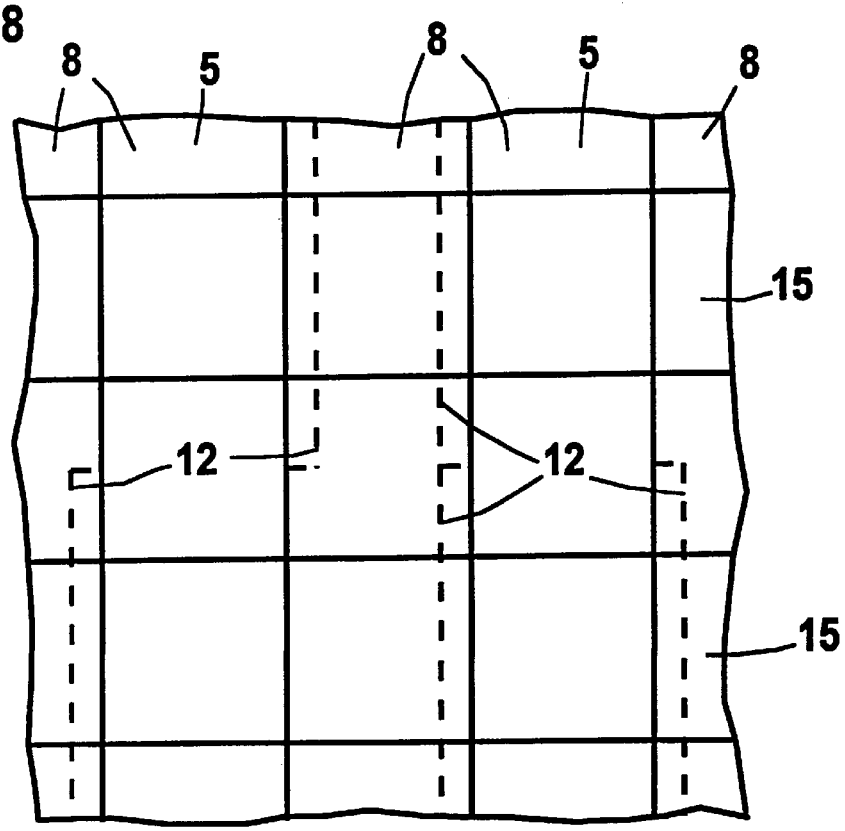
FIG. 8 shows a plan view of the substrate after formation of the word lines.

FIG. 8 illustrates a plan view of the memory cell arrangement. The course of the word lines 15 transversely with respect to the trenches 5 is shown. Also depicted are the strip-like, doped regions 8, which run on the bottom of the trenches 5 and between adjacent trenches 5. Dopant regions 12 in the sides of the trenches are depicted as a dashed contour.

Each memory cell comprises a vertical MOS transistor which has an extent of 2 F parallel to the course of the strip-like trenches 5 and an extent of F perpendicular to the course of the strip-like trenches 5. The space requirement for each memory cell is therefore 2 F$^2$.

The production of the memory cell arrangement is concluded by the deposition of an intermediate dielectric, the opening of contact holes and the production of a metallization layer (not illustrated).

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A memory cell arrangement, comprising:
   memory cells in a substrate said substrate having, at least in a region of a main area, semiconductor material which is doped with a first conductivity type, said memory cells including memory cells of a first type in which first predetermined information is stored and memory cells of a second type in which second predetermined information is stored, each memory cell having an MOS transistor which is vertical with respect to the main area;

the vertical MOS transistors having a gate dielectric and different threshold voltages depending on whether said first or said second predetermined information is stored therein;

strip-like trenches which substantially run in parallel in the substrate;

strip-like, doped regions, which are doped with a second conductivity type opposite to the first conductivity type, on a bottom of the trenches and on the main area between adjacent trenches;

a gate dielectric on sides of the trenches;

word lines which run transversely with respect to the trenches;

each of the vertical MOS transistors being respectively formed by two strip-like, doped regions adjoining a common side of one of the trenches, trench sides arranged in between the gate dielectric and one of the word lines;

each of said memory cells of said first type and of said second type having a dopant region in an upper region of the side of the trench, with an extent of said dopant region perpendicular to the main area being smaller than a depth of the trenches; and in each of said memory cells of said second type, said dopant region being doped with said second conductivity type with an increased doping concentration compared to a doping concentration in said strip like, doped regions, to increase said threshold voltage to indicate storage of said second predetermined information.

2. The memory cell arrangement according to claim 1, wherein spacing between adjacent trenches is equal to a width of the trenches; and spacing between adjacent word lines is equal to a width of the word lines.

3. A memory cell arrangement as claimed in claim 1 wherein, in each of said memory cells of said first type, said dopant region is doped with said first conductivity type to decrease said threshold voltage to indicate storage of said first predetermined information.

* * * * *